United States Patent
Connell et al.

(10) Patent No.: US 8,588,726 B2
(45) Date of Patent: Nov. 19, 2013

(54) LOW NOISE MIXER

(75) Inventors: Lawrence E. Connell, Naperville, IL (US); Daniel P. McCarthy, Elk Grove Village, IL (US)

(73) Assignee: Futurewei Technologies, Inc., Plano, TX (US)

( * ) Notice: Subject to any disclaimer, the term of this patent is extended or adjusted under 35 U.S.C. 154(b) by 118 days.

(21) Appl. No.: 13/360,926

(22) Filed: Jan. 30, 2012

(65) Prior Publication Data
US 2012/0200334 A1      Aug. 9, 2012

Related U.S. Application Data (60) Provisional application No. 61/439,226, filed on Feb. 3, 2011.

(51) Int. Cl.
*H04B 1/26* (2006.01)
*H04K 3/00* (2006.01)

(52) U.S. Cl.
USPC .......................................... 455/326; 327/113

(58) Field of Classification Search
USPC ................... 455/313, 326, 333; 327/113, 116
See application file for complete search history.

(56) References Cited

U.S. PATENT DOCUMENTS

| | | | |
|---|---|---|---|
| 7,457,605 B2 * | 11/2008 | Thompson et al. | 455/313 |
| 2005/0197090 A1* | 9/2005 | Stockstad et al. | 455/313 |
| 2009/0088122 A1* | 4/2009 | Xu et al. | 455/333 |
| 2010/0301920 A1* | 12/2010 | Wu | 327/359 |

OTHER PUBLICATIONS

Sacchi, E. et al., "A 15 mW, 70kHz 1/f Corner Direct Conversion CMOS Receiver," IEEE 2003 Custom Integrated Circuits Conference, Proceedings of the IEEE 2003, Sep. 2003, pp. 459-462.

\* cited by examiner

*Primary Examiner* — Lee Nguyen
(74) *Attorney, Agent, or Firm* — Conley Rose, P.C.; Grant Rodolph; Clint Wilkins (57) ABSTRACT

An apparatus comprising a low noise mixer comprising a transconductance amplifier configured to receive a differential voltage and to generate a differential current signal, a passive mixer directly connected to an output of the transconductance amplifier, and a transimpedance amplifier coupled to the passive mixer, wherein the transimpedance amplifier is configured to receive a current signal and convert the current signal to a voltage signal.

20 Claims, 7 Drawing Sheets

LOW NOISE MIXER

CROSS-REFERENCE TO RELATED APPLICATIONS

The present application claims priority to U.S. Provisional Patent Application 61/439,226, filed on Feb. 3, 2011 by Lawrence E. Connell, et al., and entitled "Low Noise Mixer," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Analog front-end receivers may be used in many applications ranging from cellular radio communications (e.g., base station receivers) to television (e.g., cable television tuners). Analog front-end receivers present many design challenges and/or constraints. Among the desired features of analog front-end receivers may be high gain, high linearity, low noise, low power dissipation, and suppression of spurs at intermediate frequencies.

SUMMARY

In one aspect, the invention includes an apparatus comprising a low noise mixer comprising a transconductance amplifier configured to receive a differential voltage and to generate a differential current signal, a passive mixer directly connected to an output of the transconductance amplifier, and a transimpedance amplifier coupled to the passive mixer, wherein the transimpedance amplifier is configured to receive a current signal and convert the current signal to a voltage signal.

In another aspect, the invention includes a method comprising receiving a differential voltage signal at a low noise mixer, wherein the low noise mixer comprises a transconductance amplifier, a passive mixer directly connected to an output of the transconductance amplifier, and a transimpedance amplifier coupled to the passive mixer, generating a differential current signal from the differential voltage signal using the transconductance amplifier, changing a frequency of the differential current signal using a differential local oscillator to generate a second differential current signal using the passive mixer, and converting the second differential current signal to a second differential voltage signal using the transimpedance amplifier.

In yet another aspect, the invention includes an apparatus comprising a differential local oscillator, a first surface acoustic wave (SAW) filter, a second SAW filter coupled to the first SAW filter, wherein the second SAW filter is configured to generate a first differential voltage signal, and a low noise mixer coupled to the second SAW filter, wherein the low noise mixer comprises a transconductance amplifier configured to receive the first differential voltage signal and generate a first differential current signal, a transimpedance amplifier coupled to the transconductance amplifier and configured to receive a second differential current signal and generate a second differential voltage signal, and a passive mixer coupled between the transconductance amplifier and the transimpedance amplifier and coupled to the differential local oscillator, wherein the passive mixer is configured to receive the first differential current signal.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Analog front-end receivers may have a function of receiving a high-frequency data-bearing signal and converting this signal to an intermediate frequency signal while conditioning the signal for further processing. Disclosed herein are analog front-end receivers that achieve desirable characteristics such as high gain, very low noise, and high linearity while at the same time achieving reduced power consumption with a simpler design than conventional receivers. Also disclosed herein is a very low noise and high linearity mixer which comprises an input transconductor, which converts an input voltage to an output current, a passive switching mixer, which is directly coupled to the input transconductor output, and a transimpedance amplifier. Also disclosed herein are methods of processing high-frequency signals to achieve desirable signal characteristics compared with conventional methods.

Figure 1:
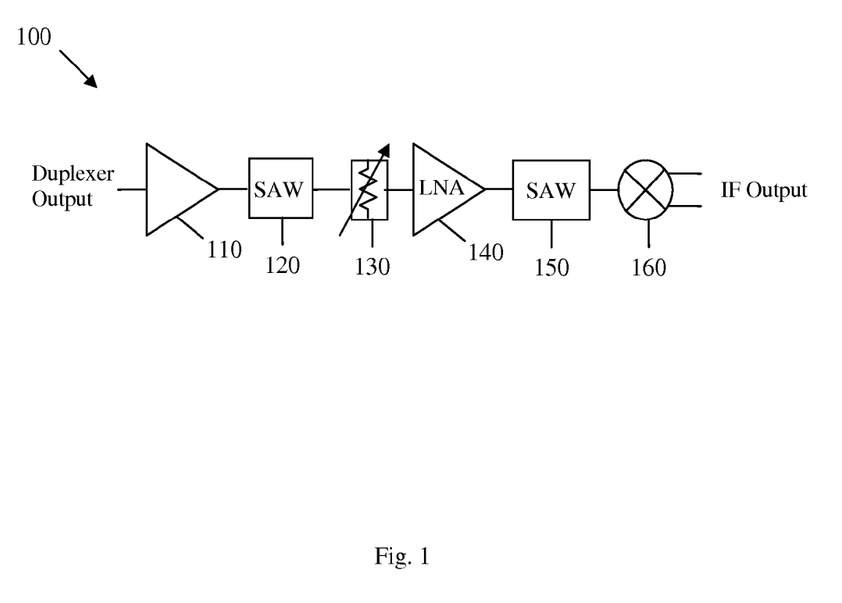
FIG. 1 is a schematic diagram of an embodiment of an analog front-end receiver.

FIG. 1 is a schematic diagram of an embodiment of an analog front-end receiver 100. The analog front-end receiver 100 comprises an amplifier 110, a first surface acoustic wave (SAW) filter 120, a variable attenuator 130, a low noise amplifier 140, a second SAW filter 150, and mixer 160 configured as shown in FIG. 1. The amplifier 110 may be configured to receive a high-frequency analog signal from a duplexer and may be configured to amplify the analog signal. The high-frequency analog signal may, for example, be a signal received in a base station in a cellular communication system, and the amplifier 110 may, for example, be a low noise amplifier used to drive a signal on a long cable in a base station. The first SAW filter 120 may be a bandpass filter and may provide protection against an image frequency. The variable attenuator 130 may reduce an amplitude of a signal, and the attenuation may be adjustable. The low noise amplifier 140 may provide a gain and may mitigate against noise introduced by subsequent stages of the receiver. The second SAW filter 150 may be a bandpass filter and may provide protection against an image frequency. The mixer 160 may be a conventional single-ended-to-differential mixer that may convert a relatively high-frequency signal to a lower or intermediate frequency (IF) signal for subsequent processing. The mixer 160 may be coupled to a differential local oscillator at a given frequency to help perform the described frequency conversion.

The analog front-end receiver 100 in FIG. 1 represents a conventional configuration and may be used in radio-frequency (RF) wireless receivers such as base station receivers in a cellular communication system. For example, the analog front-end receiver 100 may be coupled to one or more antennas for receiving RF signals that have been converted to electrical signals.

The analog front-end receiver 100 may suffer from several drawbacks, however. First, the presence of the low noise amplifier 140 and its associated current drain may result in excessive power consumption. Second, spurs encountered in the mixer 160 may also be excessive due at least in part to amplified signal levels generated by the low noise amplifier 140.

Figure 2:
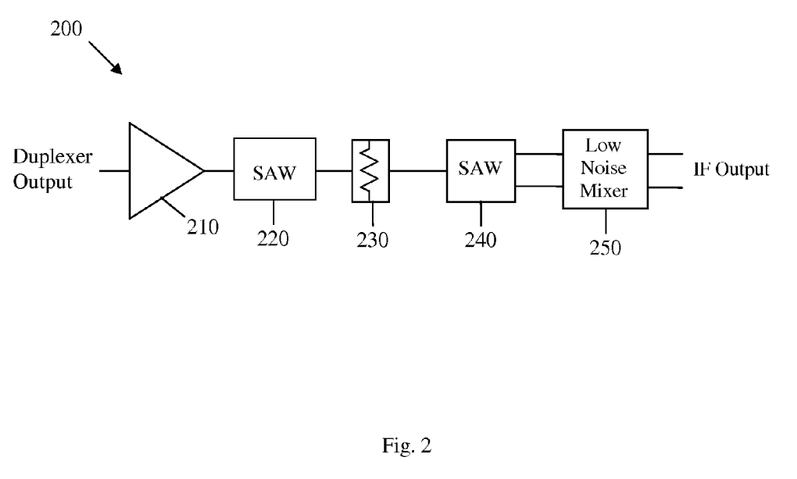
FIG. 2 is a schematic diagram of another embodiment of an analog front-end receiver.

FIG. 2 is a schematic diagram of another embodiment of an analog front-end receiver 200 that may overcome some of the drawbacks of conventional receivers, such as analog front-end receiver 100. The analog front-end receiver 200 comprises an amplifier 210, a first SAW filter 220, an attenuator 230, a second SAW filter 240, and a low noise mixer 250 configured as shown in FIG. 2. The amplifier 210 may be configured to receive a high-frequency analog signal from a duplexer and may be configured to amplify the analog signal. The high-frequency analog signal may, for example, be a signal received in a base station in a cellular communication system, and the amplifier 210 may, for example, be a low noise amplifier used to drive a signal on a long cable in a base station. The first SAW filter 220 may be a bandpass filter and may provide protection against an image frequency. The attenuator 230 may attenuate the signal at the output of the first SAW filter 220. The second SAW filter 240 may be directly connected to the attenuator 230 and may filter source noise at an image frequency. Alternatively, there may be no attenuator between the first 220 and second 240 SAW filters. For example, an attenuator, such as attenuator 230, may be placed after the second SAW filter 240, or sufficient attenuation may be introduced into another component such that a separate attenuator may not be needed. Further, the second SAW filter 240 may be a single-ended-to-differential SAW filter that may convert a single-ended input into a differential output. SAW filters, such as SAW filters 220 and 240, may be connected in series to provide sufficient out of band protection. The low noise mixer 250 may be configured to receive a differential input at one frequency at an input and generate an output at a lower frequency or an IF. The low noise mixer 250 may be coupled to a local oscillator at a given frequency to help perform the described frequency conversion.

Note that the analog front-end receiver 200 may not require a low noise amplifier between SAW filters 220 and 240 in order to process a received signal. As a result, voltages internal to the analog front-end receiver 200 may be smaller than conventional receivers, which may lead to improved linearity and lower spurs compared to conventional receivers, such as analog front-end receiver 100.

Figure 3:
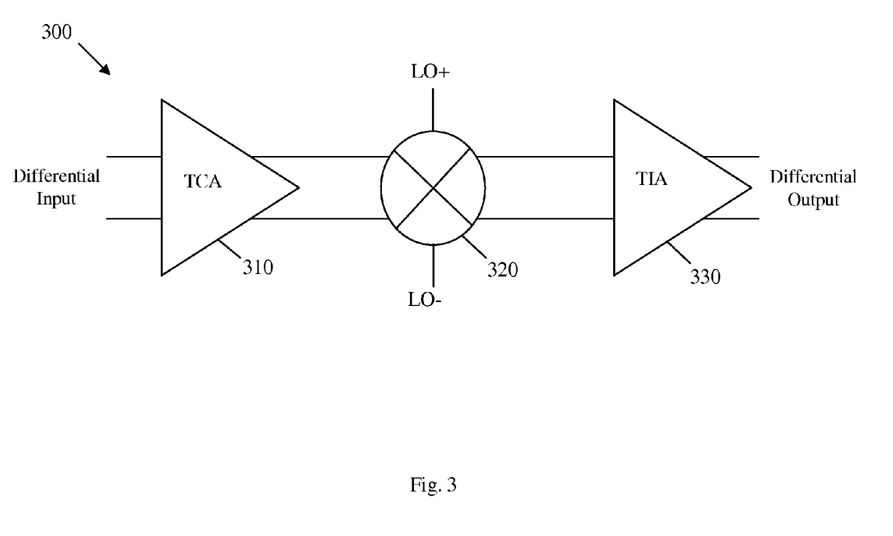
FIG. 3 is a schematic diagram of an embodiment of a low noise mixer.

FIG. 3 is a schematic diagram of an embodiment of a low noise mixer 300. The low noise mixer 300 may be employed as a low noise mixer in an analog front-end receiver, such as receiver 200 in FIG. 2. For example, low noise mixer 250 in FIG. 2 may be configured as low noise mixer 300 in FIG. 3. Low noise mixer 300 may be employed in base station architectures or cable television tuners.

Low noise mixer 300 comprises a transconductance amplifier 310, a passive mixer 320 (sometimes referred to as a passive switching mixer), and a transimpedance amplifier 330 configured as shown in FIG. 3. The transconductance amplifier 310 may receive a differential voltage signal at an input (labeled as "Differential Input" in FIG. 3) and generate a differential current signal at an output. The differential current signal may comprise a direct current (DC) component and an alternating current (AC) component.

The passive mixer 320 may be coupled to differential local oscillator signals LO+ and LO− as shown in FIG. 3. The passive mixer may receive the AC component and shift a frequency of the AC component to a lower or IF frequency. The passive mixer 320 may be configured to receive the differential current signal and to allow at least a portion of the DC component to pass through to the output and on to the transimpedance amplifier 330. A portion of the DC component may be reused to bias the transimpedance amplifier 330. The transimpedance amplifier 330 may be configured to receive the differential current signal at an input and generate a differential voltage output (labeled as "Differential Output" in FIG. 3).

Low noise mixer 300 may achieve a very low noise figure and high linearity with significantly reduced power consumption. Spurs, also referred to as mRF+/−nLO spurs by those of skill in the art, inside the low noise mixer 300 may be about 30 decibels (dB) lower than those in a conventional mixer, such as mixer 160 in FIG. 1, due to voltage levels inside the low noise mixer 300 being lower by about 30 dB due to the absence of a low noise amplifier in the receiver configuration in combination with operating the low noise mixer in current mode. Further, the analog front-end receiver 200 architecture with low noise mixer 250 using an architecture such as low noise mixer 300 may result in less than one-third of the power consumption compared with conventional front-end receiver architectures, such as analog front-end receiver 100. Finally, an architecture of an analog front-end receiver, such as analog front-end receiver 200, may also be simplified by eliminating a low noise amplifier.

Figure 4:
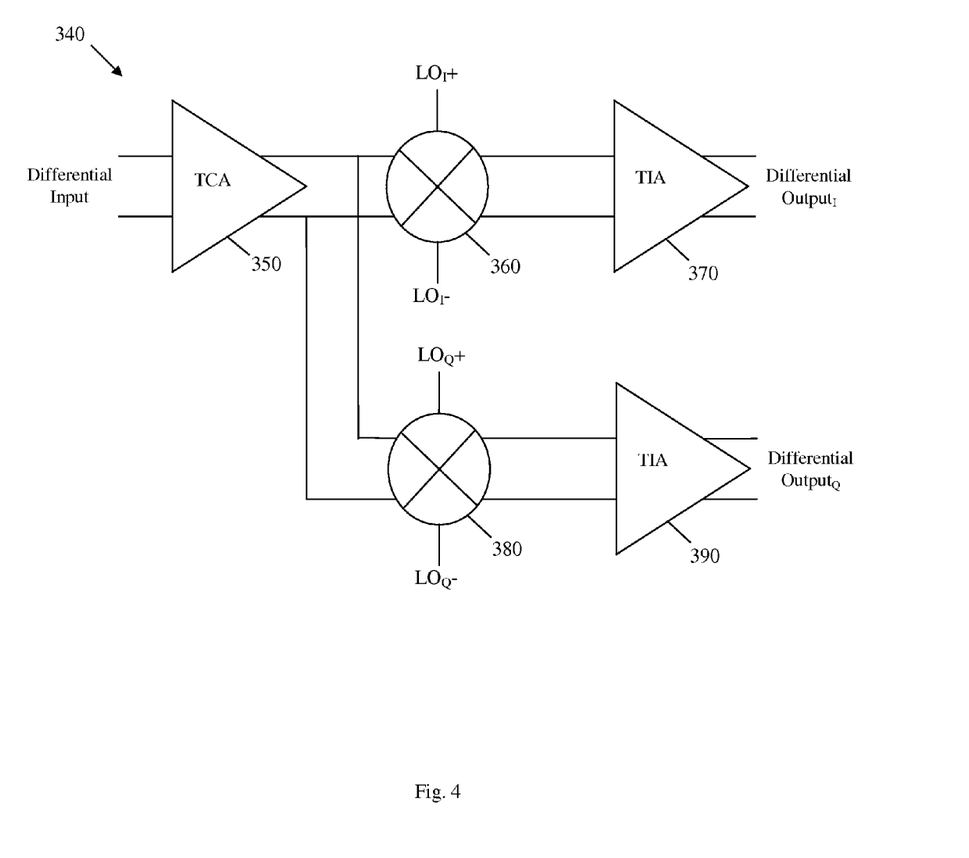
FIG. 4 is a schematic diagram of another embodiment of a low noise mixer.

FIG. 4 is a schematic diagram of an embodiment of a low noise mixer 340. The low noise mixer 340 may be employed as a low noise mixer in an analog front-end receiver, such as in a cable tuner.

Low noise mixer 340 comprises a transconductance amplifier 350, passive mixers 360 and 380, and transimpedance amplifiers 370 and 390, each of which may be similar to those components of the same name described earlier for low noise mixer 300. In some applications, such as a cable tuner application, the low noise mixer 340 may receive an AC component at one frequency and shift the frequency of the AC component to an IF frequency. In some applications, the received AC component may be converted to baseband (i.e., a differential baseband), and the local oscillator signals $LO_I+$ and $LO_I-$ may correspond to an in-phase component of the local oscillator signal and local oscillator signals $LO_Q+$ and $LO_Q-$ may correspond to a quadrature component of the local oscillator signal. The local oscillator signals $LO_I+$ and $LO_I-$ may be offset from the local oscillator signals $LO_Q+$ and $LO_Q-$, respectively, by a phase of 90 degrees. Thus, all the local oscillator signals may be derived from a single local oscillator. The outputs of transimpedance amplifiers 370 and 390 may be baseband outputs.

Figure 5:
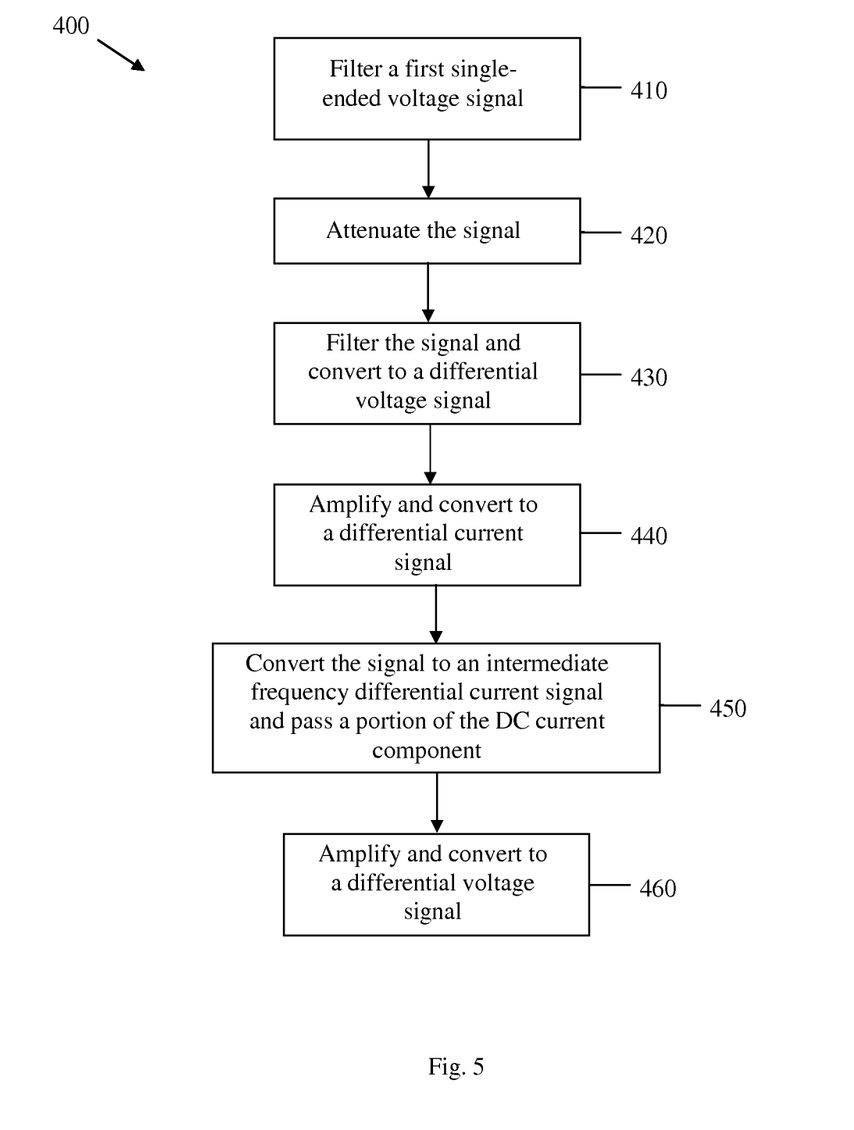
FIG. 5 is a flowchart of an embodiment of a method for processing analog signals.

FIG. 5 is a flowchart of an embodiment of a method 400 for processing analog signals. In step 410, a single-ended voltage signal may be filtered. The single-ended voltage signal may be a high-frequency signal that has been received at a duplexer in an analog front-end receiver. For example, the high-frequency signal may be an analog signal that has been received by one or more antennas in a base station receiver. The filtering may, for example, be performed by a SAW filter, such as SAW filter 220 in FIG. 2. In step 420, the signal may be attenuated. In step 430, the signal may be filtered and converted to a differential voltage signal. For example, a SAW filter such as SAW filter 240 may be used to perform such filtering and conversion. In step 440, the signal may then be amplified and converted to a differential current signal. Such processing may, for example, be performed by a transconductance amplifier such as transconductance amplifier 310 in FIG. 3. In step 450, a center frequency of the signal may be converted to an intermediate frequency and a portion of the DC current component may be maintained. Such processing may, for example, be performed by a passive mixer such as passive mixer 320 in FIG. 3. Finally, in step 460, the signal may be amplified and converted to a differential voltage signal. Such processing may, for example, be performed by a transimpedance amplifier such as transimpedance amplifier 330 in FIG. 3.

Figure 6:
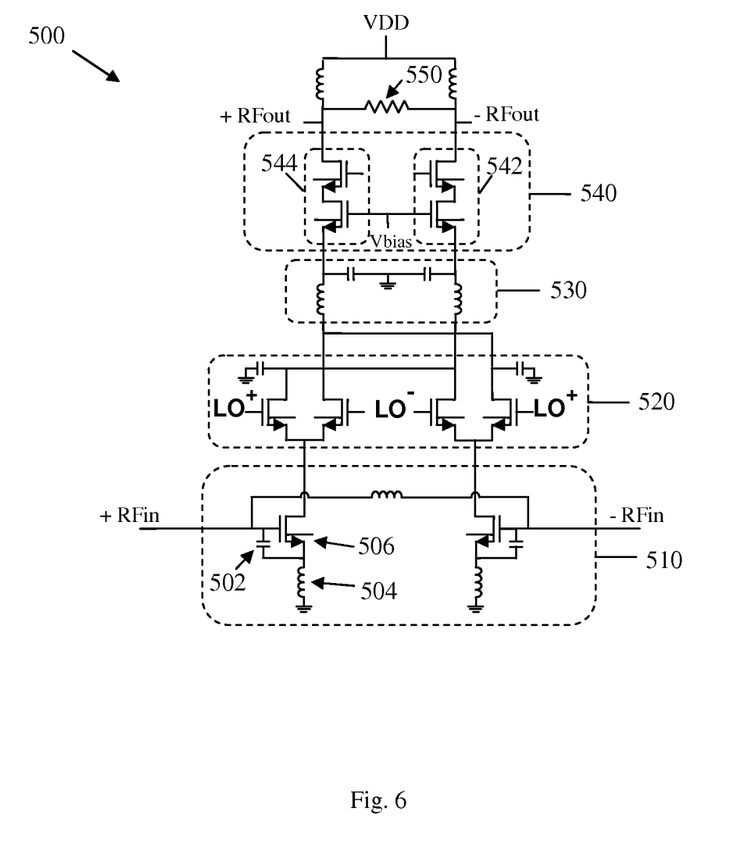
FIG. 6 is a circuit diagram of an embodiment of a low noise mixer.

FIG. 6 is a circuit diagram of an embodiment of a low noise mixer 500. Low noise mixer 500 comprises a transconductance amplifier 510, a passive mixer 520, a filter 530, and a transimpedance amplifier 540 configured as shown in FIG. 6. Transconductance amplifier 510 may comprise a plurality of capacitors (an exemplary one of which is labeled as 502), inductors (an exemplary one of which is labeled as 504), and metal-oxide-semiconductor field-effect transistors (MOSFETs) (an exemplary one of which is labeled as 506) configured as shown in FIG. 6. The MOSFETs in FIG. 6 are n-channel metal-oxide-semiconductor (MOS) transistors, but the circuit may instead be configured with p-channel MOS transistors. Transconductance amplifier 510 may represent one embodiment of transconductance amplifier 310 in FIG. 3 and/or transconductance amplifier 350 in FIG. 4. Transconductance amplifier 510 may be configured to receive differential RF voltage inputs +RFin and −Rfin as shown in FIG. 6 and generate a differential current output. The differential current output may comprise a direct current (DC) component and an alternating current (AC) component.

Passive mixer 520 may comprise a plurality of capacitors and MOSFETs as shown in FIG. 6. Passive mixer 520 may be configured to receive differential local oscillator signals LO+ and LO− as shown in FIG. 6 and a differential current signal from the transconductance amplifier 510. Further, the passive mixer 520 may be configured to pass a portion of the DC component to an output. Passive mixer 520 may represent one embodiment of passive mixer 320 in FIG. 3 and/or passive mixers 360 and 380 in FIG. 4.

Filter 530 comprises a plurality of capacitors and inductors as shown in FIG. 6. Filter 530 may be optionally included to reduce mRF+/−nLO spurs. Alternatively, filter 530 may not be included and the passive mixer 520 may be connected directly to the transimpedance amplifier 540.

Transimpedance amplifier 540 may comprise a first branch 542 and a second branch 544 as shown in FIG. 6. The first branch 542 may comprise two MOSFETs connected in series as shown in FIG. 6, and likewise the second branch 544 may comprise two MOSFETs connected in series as shown in FIG. 6. One MOSFET in each branch of the transimpedance amplifier 540 may be biased by voltage Vbias such that the MOSFETs in passive mixer 520 operate in a linear region. Transimpedance amplifier 540 may be configured to receive a differential current signal and convert the differential current signal to an differential output voltage signal, labeled in FIG. 6 as +RFout and −RFout. Transimpedance amplifier 540 may be configured to receive a DC current component from filter 530, and the DC current component may be used as a current source that biases the transimpedance amplifier 540 (i.e., an external current source may not be needed to operate the low noise mixer 500). Transimpedance amplifier 540 may represent one embodiment of transimpedance amplifier 330 in FIG. 3 and/or transimpedance amplifiers 370 and 390 in FIG. 4.

The low noise mixer 500 further comprises a load resistor 550. Low noise mixer 500 may be coupled to a voltage source with a voltage level of represented as VDD. VDD may be approximately equal to 3.3 volts (V).

The low noise mixer 500 may have an impedance at the passive mixer output of less than 3 ohms as determined by the device sizes and DC bias current used for transimpedance amplifier 540 branches 542 and 544. Further, the gain of the low noise mixer may be greater than 15 dB, the noise figure of the low noise mixer may be less than 1.4 dB, the output 1 dB compression point may be greater than 16 dB, the output third order linearity measurement (i.e., output third order intercept) may be greater than 25 dBm (measured power in dB relative to 1 milliwatt), the mRF+/−nLO spurs may be less than 137 dBc (dB relative to carrier), and the power dissipation of the low noise mixer may be less than about 370 milliwatts (mW) during operation (if VDD is approximately 3.3 V).

Figure 7:
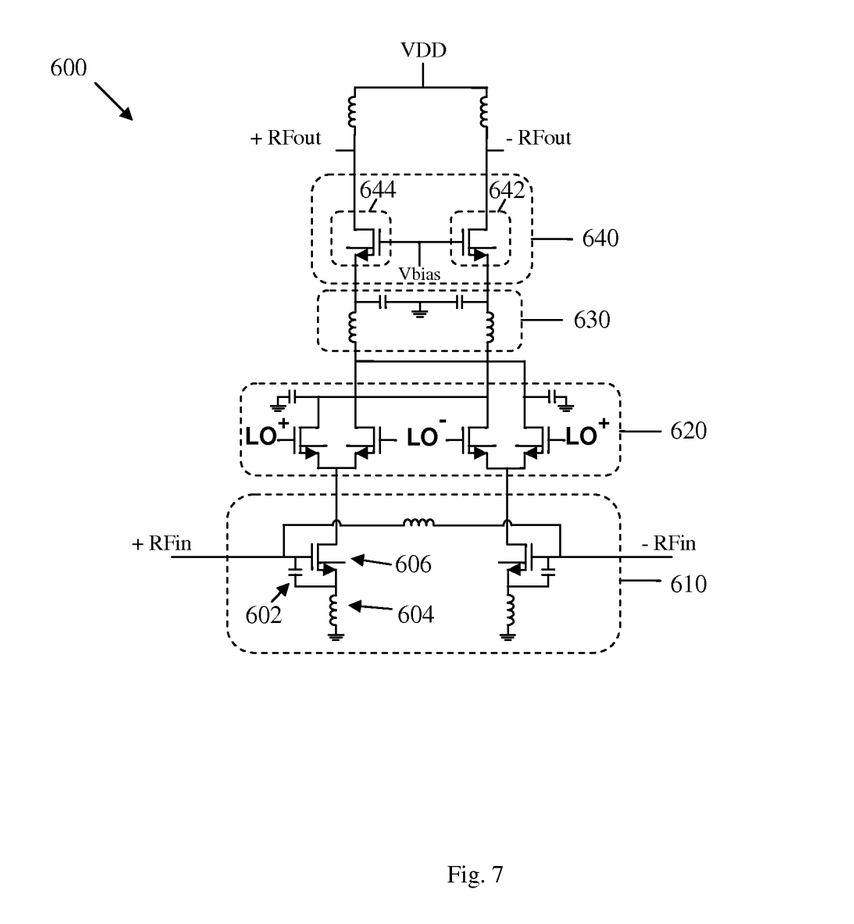
FIG. 7 is a circuit diagram of another embodiment of a low noise mixer.

FIG. 7 is a circuit diagram of another embodiment of a low noise mixer 600. Low noise mixer 600 comprises a transconductance amplifier 610, a passive mixer 620, a filter 630, and a transimpedance amplifier 640 configured as shown in FIG. 6. Transconductance amplifier 610 may comprise a plurality of capacitors (an exemplary one of which is labeled as 602), inductors (an exemplary one of which is labeled as 604), and metal-oxide semiconductor field effect transistors (MOSFETs) (an exemplary one of which is labeled as 606) configured as shown in FIG. 7. The MOSFETs in FIG. 7 are n-channel MOS transistors, but the circuit may instead be configured with p-channel MOS transistors. Transconductance amplifier 610 may represent one embodiment of transconductance amplifier 310 in FIG. 3 and/or transconductance amplifier 350 in FIG. 4.

Transconductance amplifier 610 may be configured to receive differential radio frequency voltage inputs +RFin and −Rfin as shown in FIG. 7 and generate a differential current output. The differential current output may comprise a direct current (DC) component and an alternating current (AC) component.

Passive mixer 620 may comprise a plurality of capacitors and MOSFETs as shown in FIG. 7. Passive mixer 620 may be configured to receive differential local oscillator signals LO+ and LO− as shown in FIG. 7. Further, the passive mixer 620 may be configured to pass a portion of the DC component to an output. Passive mixer 620 may represent one embodiment of passive mixer 320 in FIG. 3 and/or passive mixers 360 and 380 in FIG. 4.

Filter 630 comprises a plurality of capacitors and inductors as shown in FIG. 7. Filter 630 may be optionally included to further reduce mRF+/−nLO spurs generated by passive mixer 620. Alternatively, filter 630 may not be included and the passive mixer 620 may be connected directly to the transimpedance amplifier 640.

Transimpedance amplifier 640 may comprise a first branch 642 and a second branch 644 as shown in FIG. 7. The first branch 642 may comprise one MOSFET as shown in FIG. 7, and likewise the second branch 644 may comprise one MOSFET as shown in FIG. 7. Each MOSFET in the transimpedance amplifier 640 may be biased by a voltage (labeled as "Vbias") such that the MOSFETs in passive mixer 620 operate in a linear region. Transimpedance amplifier 640 may be configured to receive a differential current signal and convert the differential current signal to an differential output voltage signal, labeled in FIG. 7 as +RFout and −RFout. Transimpedance amplifier 640 may be configured to receive a DC current component from filter 630, and the DC current component may be used as a current source that biases the transimpedance amplifier 640 (i.e., an external current source may not be needed to operate the low noise mixer 600). Transimpedance amplifier 640 may represent one embodiment of transimpedance amplifier 330 in FIG. 3 and/or transimpedance amplifiers 370 and 390 of FIG. 4.

Low noise mixer 600 may be coupled to a voltage source with voltage level of approximately VDD. VDD may be approximately equal to 1.8 V. The low noise mixer 600 may have an impedance at the passive mixer 620 output of less than 3 ohms. Further, the gain of the low noise mixer may be greater than 15 dB, the noise figure of the low noise mixer may be less than 1.4 dB, the output 1 dB compression point may be greater than 16 dB, the output third order linearity measurement (i.e., output third order intercept) may exceed 25 dBm, all mRF+/−nLO spurs may be less than 137 dBc, and the power dissipation of the low noise mixer may be less than about 210 milliwatts (mW) during operation (if VDD is approximately 1.8 V).

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
a low noise mixer comprising:
a transconductance amplifier configured to receive a differential voltage and to generate a differential current signal;
a passive mixer directly connected to an output of the transconductance amplifier;
a transimpedance amplifier coupled to the passive mixer, wherein the transimpedance amplifier is configured to receive a current signal and convert the current signal to a voltage signal;
a differential local oscillator;
a first surface acoustic wave (SAW) filter; and
a second SAW filter coupled to the first SAW filter, wherein the second SAW filter is a single-ended-to-differential SAW filter,
wherein the second SAW filter is coupled to the transconductance amplifier, and wherein the differential local oscillator is coupled to the passive mixer.

2. The apparatus of claim 1, wherein the apparatus does not include a low noise amplifier.

3. The apparatus of claim 2, wherein the passive mixer further comprises a plurality of metal-oxide-semiconductor field-effect transistors (MOSFETs), wherein each of the MOSFETs is configured to operate in its linear region, wherein the differential current signal comprises a direct current (DC) component and an alternating current (AC) component, wherein the passive mixer is configured to pass a portion of the DC current component to an input of the transimpedance amplifier, and wherein the portion of the DC current component biases the transimpedance amplifier.

4. The apparatus of claim 3, wherein the transimpedance amplifier comprises a first branch corresponding to one differential input and a second branch corresponding to a second differential input, wherein the first branch comprises a first MOSFET, and wherein the second branch comprises a second MOSFET.

5. The apparatus of claim 4, wherein the first branch further comprises a third MOSFET connected in series with the first MOSFET, and wherein the second branch comprises a fourth MOSFET connected in series with the second MOSFET.

6. The apparatus of claim 5, wherein a filter comprising a plurality of inductors and capacitors is connected between the passive mixer and the transimpedance amplifier.

7. The apparatus of claim 4, wherein the low noise mixer is coupled to a voltage source of about 1.8 volts, the gain of the low noise mixer is greater than 15 decibels (dB), the noise figure of the low noise mixer is less than 1.4 decibels, the output third order intercept is greater than 25 dBm, and the power dissipation of the low noise mixer is less than about 210 milliwatts (mW) during operation.

8. The apparatus of claim 1, wherein the low noise mixer further comprises:
a second passive mixer directly connected to the output of the transconductance amplifier; and
a second transimpedance amplifier coupled to the second passive mixer, wherein the second transimpedance amplifier is configured to receive a second current signal and convert the second current signal to a voltage signal.

9. A method comprising:
receiving a differential voltage signal at a low noise mixer, wherein the low noise mixer comprises a transconductance amplifier, a passive mixer directly connected to an output of the transconductance amplifier, and a transimpedance amplifier coupled to the passive mixer;
generating a differential current signal from the differential voltage signal using the transconductance amplifier;
changing a frequency of the differential current signal using a differential local oscillator to generate a second differential current signal using the passive mixer;
converting the second differential current signal to a second differential voltage signal using the transimpedance amplifier;
receiving a voltage signal from a first surface acoustic wave (SAW) filter, wherein the voltage signal is a single-ended voltage signal;
coupling the first SAW filter to a second SAW filter; and
converting the voltage signal to the differential voltage signal using the second SAW filter.

10. The method of claim 9, wherein the differential current signal comprises a direct current (DC) component and an alternating current (AC) component, wherein the passive mixer receives the DC current component and passes a portion of the DC current component to the transimpedance amplifier, wherein the portion of the DC current component biases the transimpedance amplifier.

11. The method of claim 10, wherein the passive mixer further comprises a plurality of metal-oxide-semiconductor field-effect transistors (MOSFETs), wherein each of the MOSFETs operates in a linear region.

12. The method of claim 11, wherein the transimpedance amplifier comprises a first branch corresponding to one differential input and a second branch corresponding to a second differential input, wherein the first branch comprises a first MOSFET, and wherein the second branch comprises a second MOSFET.

13. The method of claim 12, wherein the low noise mixer is coupled to a voltage source of about 1.8 volts, the gain of the low noise mixer is greater than 15 decibels (dB), the noise figure of the low noise mixer is less than 1.4 decibels, the output third order intercept is greater than 25 dBm, and the power dissipation of the low noise mixer is less than about 210 milliwatts (mW) during operation.

14. An apparatus comprising:
a differential local oscillator;
a first surface acoustic wave (SAW) filter;
a second SAW filter coupled to the first SAW filter, wherein the second SAW filter is configured to generate a first differential voltage signal; and
a low noise mixer coupled to the second SAW filter, wherein the low noise mixer comprises:
a transconductance amplifier configured to receive the first differential voltage signal and generate a first differential current signal;
a transimpedance amplifier coupled to the transconductance amplifier and configured to receive a second differential current signal and generate a second differential voltage signal; and
a passive mixer coupled between the transconductance amplifier and the transimpedance amplifier and coupled to the differential local oscillator, wherein the passive mixer is configured to receive the first differential current signal.

15. The apparatus of claim 14, wherein the first differential current signal comprises a direct current (DC) component and an alternating current (AC) component, wherein the passive switched mixer is configured to pass a portion of the DC current component to the transimpedance amplifier, and wherein the transimpedance amplifier is configured so that the portion of the DC current component biases the transimpedance amplifier.

16. The apparatus of claim 15, wherein the apparatus does not include a low noise amplifier.

17. The apparatus of claim 16, wherein the transimpedance amplifier comprises a first branch corresponding to one differential input and a second branch corresponding to a second differential input, wherein the first branch comprises a first metal-oxide-semiconductor field-effect transistor (MOSFET), and wherein the second branch comprises a second MOSFET.

18. The apparatus of claim 17, wherein the passive switched mixer comprises four MOSFETs, wherein each MOSFET is configured to operate in its linear region.

19. The apparatus of claim 18, wherein an input impedance of the transimpedance amplifier is less than 3 ohms, wherein the low noise mixer is coupled to a voltage source of about 1.8 volts, and wherein the gain of the low noise mixer is greater than 15 decibels (dB), the noise figure is less than 1.4 decibels, the output third order intercept is greater than 25 dBm, and the power dissipation is less than about 210 milliwatts (mW) during operation.

20. The apparatus of claim 15, wherein the low noise mixer further comprises:
a second transimpedance amplifier coupled to the transconductance amplifier and configured to receive a third differential current signal and generate a third differential voltage signal; and
a second passive mixer coupled between the transconductance amplifier and the second transimpedance amplifier and coupled to the differential local oscillator, wherein the second passive mixer is configured to receive the first differential current signal.

* * * * *